(12) United States Patent
Nakua et al.

(10) Patent No.: US 7,595,585 B2
(45) Date of Patent: Sep. 29, 2009

(54) COLOR CONVERSION AND OPTICAL ENHANCEMENT LAYERS FOR ELECTROLUMINESCENT DISPLAYS

(75) Inventors: Abdul M. Nakua, Mississauga (CA); Xingwei Wu, Brampton (CA); Maizhi Yang, North York (CA); Dan Daeweon Cheong, North York (CA); John Wesley Moore, Richmond Hill (CA)

(73) Assignee: Ifire IP Corporation, Fort Saskatchewan, Alberta (CA)

( * ) Notice: Subject to any disclaimer, the term of this patent is extended or adjusted under 35 U.S.C. 154(b) by 391 days.

(21) Appl. No.: 11/604,137

(22) Filed: Nov. 24, 2006

(65) Prior Publication Data

US 2007/0120477 A1 May 31, 2007

(51) Int. Cl.
*H01L 51/50* (2006.01)
*H05B 33/00* (2006.01)
*H01L 51/56* (2006.01)

(52) U.S. Cl. .................. 313/501; 313/512; 313/110; 445/24; 445/25; 427/64; 427/66

(58) Field of Classification Search ......... 313/500–512, 313/110–113; 445/24–25; 427/64, 66
See application file for complete search history.

(56) References Cited

U.S. PATENT DOCUMENTS

| 4,518,225 | A | 5/1985 | Fredrickson et al. |
|---|---|---|---|
| 5,432,015 | A | 7/1995 | Wu et al. |
| 6,072,450 | A | 6/2000 | Yamada et al. |
| 6,608,439 | B1 * | 8/2003 | Sokolik et al. ............. 313/512 |
| 6,844,670 | B2 | 1/2005 | Kuma et al. |
| 6,873,093 | B2 | 3/2005 | Yu |
| 7,393,618 | B2 * | 7/2008 | Ioku et al. ................. 427/162 |
| 2004/0051444 | A1 | 3/2004 | Schaepkens et al. |
| 2004/0051781 | A1 * | 3/2004 | Kawaguchi et al. ........... 348/34 |
| 2004/0135495 | A1 | 7/2004 | Wu et al. |
| 2004/0170865 | A1 | 9/2004 | Hamada et al. |
| 2005/0089772 | A1 * | 4/2005 | Kawaguchi et al. ......... 428/690 |
| 2005/0116621 | A1 | 6/2005 | Bellmann et al. |
| 2005/0123791 | A1 | 6/2005 | Deaton et al. |
| 2005/0127824 | A1 | 6/2005 | Mori et al. |
| 2005/0140265 | A1 | 6/2005 | Hirakata |
| 2005/0249971 | A1 | 11/2005 | Li |
| 2005/0261400 | A1 | 11/2005 | Yang |
| 2006/0125389 | A1 | 6/2006 | Song et al. |

FOREIGN PATENT DOCUMENTS

WO   WO 2004/036961   4/2004

* cited by examiner

*Primary Examiner*—Mariceli Santiago
(74) *Attorney, Agent, or Firm*—Fay Sharpe LLP

(57) ABSTRACT

A pixel sub-structure for an electroluminescent display and a method for making the same. The sub-structure comprising: a color conversion layer; and an optical enhancement layer; wherein at least a portion of the color conversion layer is integrated with at least a portion of the optical enhancement layer.

64 Claims, 6 Drawing Sheets

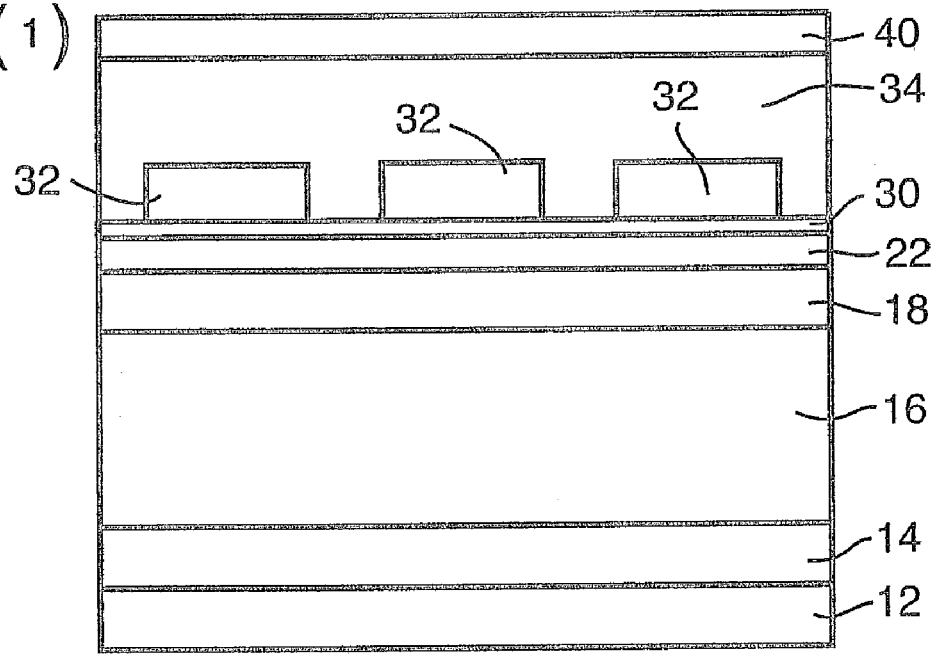
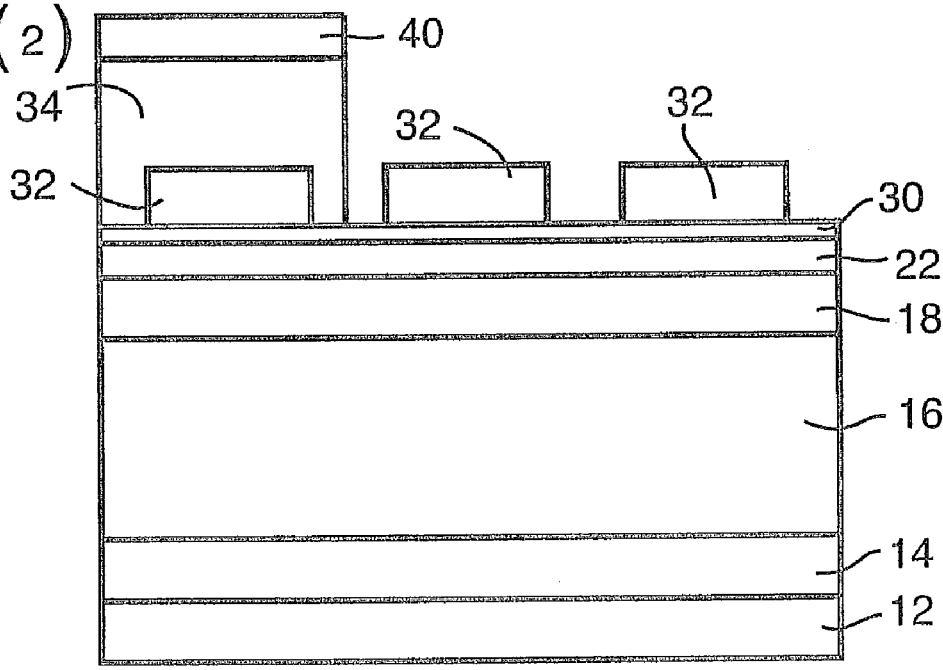

COLOR CONVERSION AND OPTICAL ENHANCEMENT LAYERS FOR ELECTROLUMINESCENT DISPLAYS

FIELD OF THE INVENTION

The present invention relates to electroluminescent displays. In particular, the present invention relates to colour conversion and optical enhancement layers for an electroluminescent display.

BACKGROUND TO THE INVENTION

Electroluminescent displays are well known in the art. Thick dielectric electroluminescent displays have been developed that provide a very high luminance as described, for example, in Applicant's U.S. Pat. No. 5,432,015, the subject matter of which is incorporated herein by reference.

Improvement to thick dielectric electroluminescent displays relate to the use of a blue light-emitting electroluminescent phosphor and a photoluminescent colour conversion layer to generate red and green light, which is described in Applicant's co-pending U.S. patent application Ser. No. 10/661,728, the subject matter of which is incorporated herein by reference. Further developments of photoluminescent colour conversion materials used in the colour conversion layer have been obtained to improve the luminance and operating stability of the display, which is described in Applicant's co-pending U.S. Provisional Patent Application 60/571,941, the subject matter of which is incorporated herein by reference.

Provided that substantially all of the blue light emitted from the blue light-emitting electroluminescent phosphor is absorbed by the colour conversion layer, the emission colour of the colour conversion layer is dependent upon the photoluminescent colour conversion material and not the light from the blue-emitting electroluminescent phosphor used to excite the colour conversion materials. With careful selection of the colour conversion materials, the emission spectra for red and green sub-pixels can approximate that required to meet commercial television application standards such as the National Television System Committee (NTSC) or European Broadcasting Union (EBU) colour gamut standards. Nevertheless, some colour correction is required to fully meet these standards. For example, the contrast and colour balance of a display can be adversely affected by the reflection of ambient light from the display surface or from the interfaces between different layers in the display structure. Typically, achievement of adequate contrast requires the use of a separate contrast enhancement filter and a separate colour-correcting optical filter. The combination of filters is designed to minimize the reflectance of ambient light while minimizing absorption of the light emitted from the display. The filters may each be deposited on the front viewing surface of the display, which in the case of an electroluminescent display incorporating a colour conversion layer, may be on the colour conversion layer itself. Alternatively, the filters can be deposited on a separate sheet of glass which is then aligned and affixed to the viewing side of the display. The separate sheet of glass may also serve to protect the active portion of the display from degradation due to atmospheric contaminants such as oxygen or water.

Typically, each of the contrast enhancement filters, each of the separate colour-correcting optical filters, and each of the colour conversion layers have to be patterned separately since a particular filter layer differentially absorbs light from red, green and blue sub-pixels. Different filter layer materials are required for each. If the filters are formed on a separate sheet of glass, the filter patterns must be accurately aligned with the underlying sub-pixel structure, which has a similarly patterned colour conversion layer.

It is therefore desirable to provide a colour electroluminescent display in a more cost effective and operationally effective manner that can be fabricated more easily, providing a desired colour correction.

SUMMARY OF THE INVENTION

In accordance with an aspect of the present invention, there is provided a pixel sub-structure for an electroluminescent display, the sub-structure comprising:
a colour conversion layer; and
an optical enhancement layer;
wherein at least a portion of the colour conversion layer is integrated with at least a portion of the optical enhancement layer.

In accordance with another aspect of the present invention, there is provided a pixel sub-structure for a thick film dielectric electroluminescent display, the pixel sub-structure comprising:
at least two sub-pixels, each sub-pixel comprising a blue light emitting electroluminescent inorganic phosphor layer;
at least one colour conversion layer, each colour conversion layer being associated with a respective one of the sub-pixels such that the blue light emitted by each respective one of the sub-pixels is substantially absorbed by the associated colour conversion layer thereby causing the colour conversion layer to emit a coloured light other than the blue light; and
at least one optical enhancement layer, at least a portion of each optical enhancement layer being integrated with at least a portion of a respective one of the colour conversion layers.

In accordance with a further aspect of the present invention, there is provided a pixel sub-structure as described above for a thick film dielectric electroluminescent display, the pixel sub-structure comprising:
three sub-pixels, each sub-pixel comprising the blue light emitting electroluminescent inorganic phosphor layer; and
a first colour conversion layer associated with one of the sub-pixels such that the blue light emitted by that sub-pixel is substantially absorbed by the first colour conversion layer thereby causing the first colour conversion layer to emit a coloured light other than the blue light;
a second colour conversion layer associated with an other one of the sub-pixels such that the blue light emitted by that sub-pixel is substantially absorbed by the second colour conversion layer thereby causing the second colour conversion layer to emit a coloured light other than the blue light and the coloured light of the first colour conversion layer; and
at least one optical enhancement layer, at least a portion of each being integrated with at least a portion of a respective one of the colour conversion layers.

In accordance with yet another aspect of the present invention, there is provided a thick film dielectric electroluminescent display having pixels, each pixel comprising, in sequence:
a substrate;
a row electrode;
a thick dielectric layer; and
a pixel sub-structure as described above.

In accordance with another aspect of the present invention, there is provided a thick film dielectric electroluminescent display having pixels, each pixel comprising a thick dielectric layer associated with a pixel sub-structure, the pixel sub-structure comprising:

a blue light emitting electroluminescent phosphor layer;

at least two viewing side electrodes associated with the blue emitting electroluminescent phosphor layer;

at least one colour conversion layer, each colour conversion layer being associated with a respective one of the viewing side electrodes such that the blue light emitted by the electroluminescent phosphor layer is substantially absorbed by the associated colour conversion layer thereby causing the colour conversion layer to emit a coloured light other than the blue light; and at least one optical enhancement layer, at least a portion of each optical enhancement layer being integrated with at least a portion of a respective one of the colour conversion layers.

In another aspect of the present invention, there is provided a method for making a pixel sub-structure for an electroluminescent display, the pixel sub-structure comprising a colour conversion layer associated with an optical enhancement layer, the method comprising:

a) forming a colour conversion layer;

b) forming an optical enhancement layer associated with the colour conversion layer; and c) integrating at least a portion of the colour conversion layer with at least a portion of the optical enhancement layer.

In another aspect, the colour conversion layer is capable of being etched and has a sufficient rigidity to support at least one additional layer without substantial deformation. In yet another aspect, the colour conversion layer is partially cured so that it is capable of being etched and has a sufficient rigidity to support said at least one additional layer without substantial deformation. In still another aspect, the optical enhancement layer is disposed on the colour conversion layer.

In another aspect, the optical enhancement layer is capable of being etched and has a sufficient rigidity to support at least one additional layer without substantial deformation. In yet another aspect, the optical enhancement layer is partially cured so that it is capable of being etched and has a sufficient rigidity to support said at least one additional layer without substantial deformation. In still another aspect, the colour conversion layer is disposed on the optical enhancement layer.

In accordance with yet another aspect of the present invention, there is provided a method of making a pixel sub-structure for a thick film dielectric electroluminescent display, the pixel sub-structure comprising at least two sub-pixels, each sub-pixel comprising a blue light emitting electroluminescent inorganic phosphor layer, the method comprising:

disposing a colour conversion layer over said at least two sub-pixels and partially curing the colour conversion layer;

disposing an optical enhancement layer over the partially cured colour conversion layer; and patterning the optical enhancement layer and the partially cured colour conversion layer together whereby the colour conversion layer and optical enhancement layer are associated with at least one of said sub-pixels such that the blue light emitted by said at least one sub-pixels is substantially absorbed by the colour conversion layer thereby causing said colour conversion layer to emit a coloured light other than the blue light and such that coloured light is substantially colour corrected by the optical enhancement layer.

In accordance with yet another aspect of the present invention, there is provided a method of making a pixel sub-structure for a thick film dielectric electroluminescent display, the pixel sub-structure comprising at least two sub-pixels, each sub-pixel comprising a blue light emitting electroluminescent inorganic phosphor layer, the method comprising:

disposing an optical enhancement layer onto a transparent cover plate and partially curing the optical enhancement layer;

disposing a colour conversion layer over the partially cured optical enhancement layer; and patterning the partially cured optical enhancement layer and the colour conversion layer together;

disposing the transparent cover plate, comprising the optical enhancement layer and the colour conversion layer, over said at least two sub-pixels whereby the colour conversion layer and optical enhancement layer are associated with at least one of said sub-pixels such that the blue light emitted by said at least one sub-pixels is substantially absorbed by the colour conversion layer thereby causing said colour conversion layer to emit a coloured light other than the blue light and such that coloured light is substantially colour corrected by the optical enhancement layer.

Other features and advantages of the present invention will become apparent from the following detailed description. It should be understood, however, that the detailed description and the specific examples while indicating embodiments of the invention are given by way of illustration only, since various changes and modifications within the spirit and scope of the invention will become apparent to those skilled in the art from said detailed description.

BRIEF DESCRIPTION OF THE DRAWINGS

The present invention will become more fully understood from the description given herein, and from the accompanying drawings, which are given by way of illustration only and do not limit the intended scope of the invention.

DETAILED DESCRIPTION OF THE INVENTION

Figure 1A:
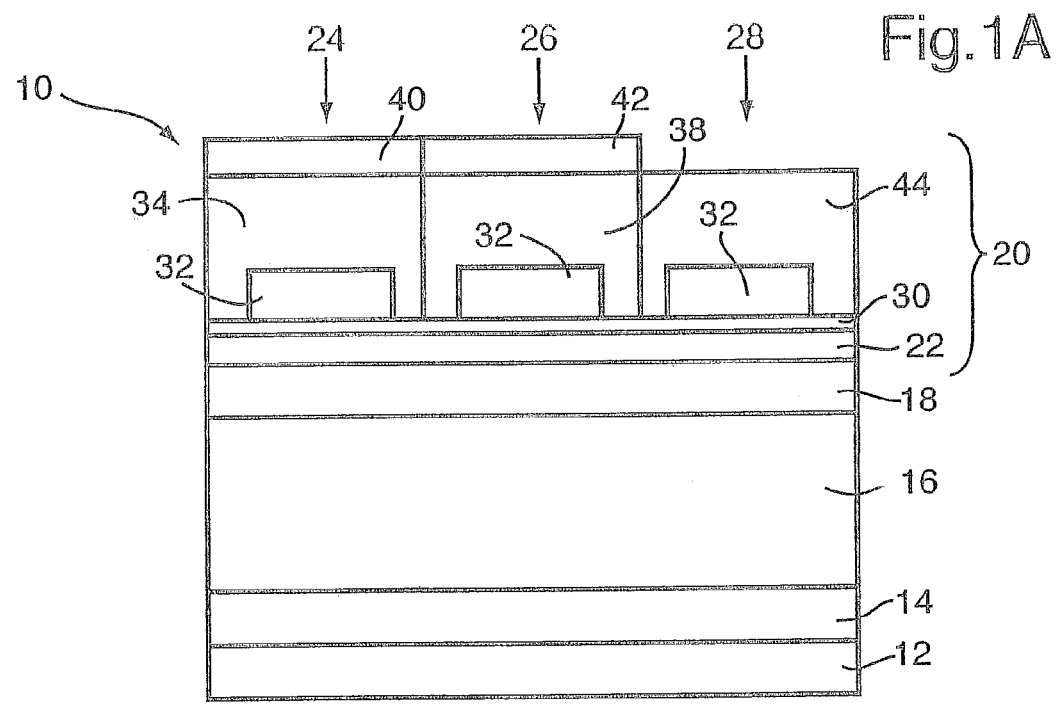
FIG. 1A is a schematic cross-section of a thick film dielectric electroluminescent display showing an embodiment of the present invention.

The present invention relates to an optical enhancement layer associated with a colour conversion layer for an electroluminescent display and a method for making the same. The invention facilitates cost effective improvement of the colour fidelity of the display through the use of an optical enhancement layer that can combine the functions of contrast enhancement and colour-correcting optical filtration. Such optical enhancement layers are useful in any electroluminescents cent display but are particularly useful for multi-colour electroluminescent displays and thick film dielectric electroluminescent displays.

In a sub-structure of an electroluminescent display, the sub-structure can comprise the colour conversion layer and the optical enhancement layer, wherein the optical enhancement layer is associated with the colour conversion layer to improve colour fidelity. The sub-structure may comprise, for example, a blue-emitting electroluminescent inorganic phosphor layer, the colour conversion layer and the optical enhancement layer, wherein the blue-emitting electroluminescent inorganic phosphor layer is associated with the colour conversion layer and the optical enhancement layer to improve colour fidelity. The colour conversion layer can be integrated with the optical enhancement layer thermally or photochemically. For instance, the layers can be patterned together using a photolithographic method, such as a single mask self-aligning photolithographic method, to initiate integration of the colour conversion layer and the optical enhancement layer. With respect to the terms "integration" or "integrated", these terms may be understood to include covalently bonded such as, for example, and without being limited thereto, cross-linked.

The colour conversion layers can absorb blue light and emit a coloured light other than blue light depending on the composition of the colour conversion layers. Therefore, the colour conversion layers can convert blue light to red light and green light for colour electroluminescent displays. The optical enhancement layer, in combination with the colour conversion layer, can improve the colour fidelity of the display. Also, the optical enhancement layer, in combination with the blue phosphor layer, can improve the colour fidelity of the display.

The optical enhancement layer can be used, more specifically, in a thick film dielectric electroluminescent display. For example, a pixel sub-structure of a thick film dielectric electroluminescent display can comprise at least two sub-pixels. Each sub-pixel has a blue light emitting electroluminescent inorganic phosphor layer. There is at least one colour conversion layer, wherein each colour conversion layer is associated with a respective one of the sub-pixels such that the blue light emitted by each respective one of the sub-pixels is substantially absorbed by the associated colour conversion layer thereby causing the colour conversion layer to emit a coloured light other than the blue light. The sub-pixel further comprises at least one optical enhancement layer. Each optical enhancement layer may be a combined contrast enhancement and colour-correcting optical filter layer. Each optical enhancement layer is associated with a respective one of the colour conversion layers such that the coloured light emitted by each respective one of the colour conversion layers is substantially colour corrected. It is not necessary for the optical enhancement layer to be associated with a colour conversion layer. At least one of the optical enhancement layers can be directly associated with a respective one of the sub-pixels such that the blue light emitted by each respective one of the sub-pixels is directly substantially colour corrected without the use of a colour conversion layer.

The coloured light emitted by the colour conversion layer(s) of the pixel sub-structures have a distribution of wavelengths longer than those for blue light, which are typically red or green. The pixel sub-structures are then incorporated into thick film dielectric electroluminescent displays. In particular, the thick film dielectric electroluminescent displays have a number of pixels. Each pixel comprises the pixel sub-structure.

A specific embodiment of the thick film dielectric electroluminescent display incorporates three sub-pixels having a blue-light emitting electroluminescent phosphor layer, wherein one sub-pixel emits blue light directly and may have an overlying optical enhancement layer and the other two sub-pixels have overlying colour conversion layers that emit green and red light, respectively, and wherein each colour conversion layer has an overlying optical enhancement layer to improve the colour fidelity of the display. With reference to FIG. 1A, there is provided an electroluminescent device 10 incorporating a sub-structure 20, in accordance with this embodiment.

The electroluminescent display 10, has a substrate 12 upon which is located a row electrode 14, a thick film dielectric layer 16 and a thin film dielectric layer 18. The sub-structure 20 is located on the thin film dielectric layer 18. The sub-structure comprises a blue-emitting electroluminescent phosphor layer 22 of europium activated barium thioaluminate and a thin film dielectric layer 30 located on the electroluminescent phosphor layer 22. The blue-emitting electroluminescent phosphor layer 22 and thin film dielectric layer 30 is deposited using a method as described in Applicant's U.S. Patent Publication 2002/0122895, the subject matter of which is herein incorporated by reference. The sub-structure 20 further comprises three sub-pixel columns, 24, 26 and 28, located thereon. Sub-pixel columns 24, 26 and 28 each have a viewing side electrode 32 located over the thin film dielectric layer 30. Each of the viewing side electrodes typically comprises indium tin oxide (ITO).

The configuration of the viewing side electrodes 32 are referred to as patterned (e.g. a suitable design). Each viewing side electrode 32 may comprise the same or different material. The pixel sub-structure 20 further comprises colour conversion layers, which are photoluminescent phosphor layers. In this embodiment, a portion of an optical enhancement layer 40 is integrated with a portion of a photoluminescent red-emitting colour conversion layer 34 (first colour conversion layer), which is located over the viewing side electrode 32 of the sub-pixel column 24. A portion of an optical enhancement layer 42 is integrated with a portion of a photoluminescent green-emitting colour conversion layer 38 (second colour conversion layer), which is located over the viewing side electrode 32 of the sub-pixel column 26. An optical enhancement layer 44 is located over the viewing side electrode 32 of the sub-pixel column 28. The optical enhancement layers 40, 42 and 44 are combined contrast enhancement and colour-correcting optical filtration layers. In this embodiment, the viewing side electrode 32 is made of an inert material to inhibit any potential reaction of the colour conversion layers 34 and 38 and the optical enhancement layer 42 with the viewing side electrode 32. An optically transparent barrier layer of an inert material can be disposed between the viewing side electrodes 32 and the deposited colour conversion layers 34 and 38 and the optical enhancement layer 42 to inhibit any potential reaction of the colour conversion layers 34 and 38 with the viewing side electrode 32. Optically transparent barrier layers are known. Any suitable optically transparent barrier layer may be used.

Figure 1B:
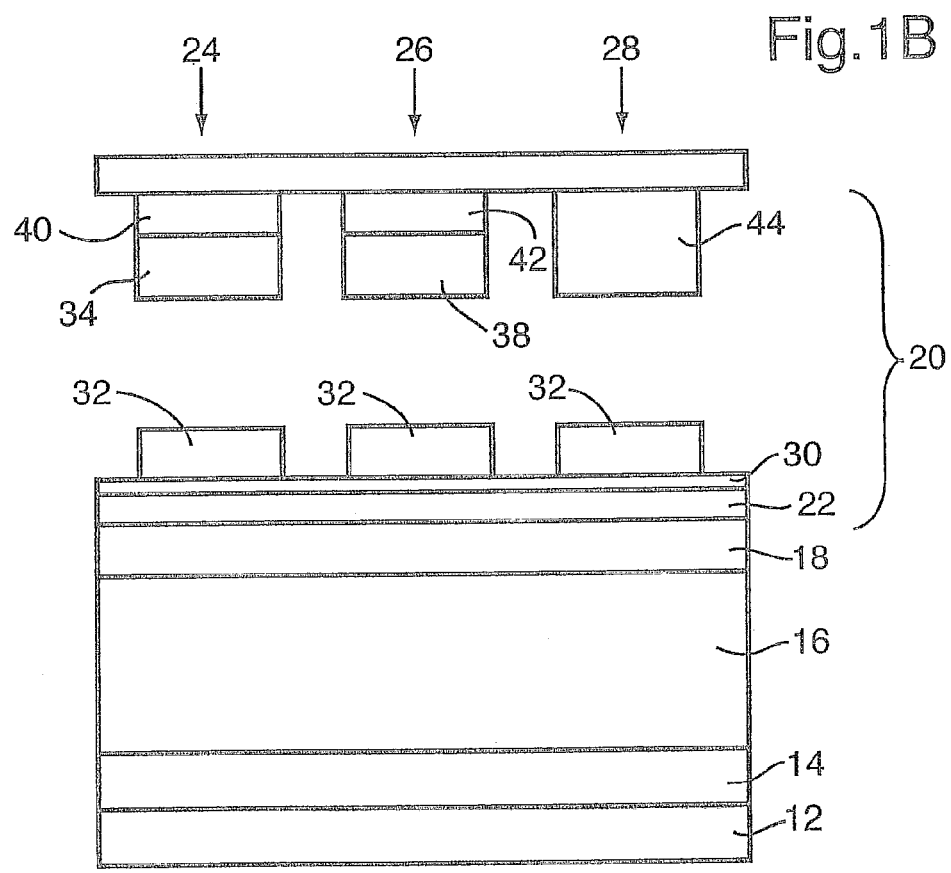
FIG. 1B is a schematic cross-section of a thick film dielectric electroluminescent display showing another embodiment of the present invention.

In another embodiment and as shown in FIG. 1B, the associated colour conversion layers (34 and 38) and optical enhancement layers (40 and 42, respectively) and the optical enhancement layer (44) are deposited on a transparent cover plate 36 facing the array of blue emitting subpixels (22, 30 and 32). The layers are aligned with and adhered to the array of blue emitting subpixels (22, 30 and 32). The space, defined between the array of blue emitting subpixels (22, 30 and 32) and the combined layers (34 and 40; 38 and 42) or single optical enhancement layer 44 may be filled with a material having an optical index of refraction sufficiently large to inhibit internal reflection of the blue light generated from the blue-emitting electroluminescent phosphor layer 22 back into the internal structure of the display.

Alternatively, the colour conversion layers 34 and 38 and the optical enhancement layers 40, 41 and 42 may be deposited on the top of the cover plate 36. When deposited on top of the cover plate 36, the colour conversion layers 34 and 38 and the optical enhancement layers 40, 41 and 42 may be protected from the ambient atmosphere with the use of a coating of an optically transparent passivating layer.

In other embodiments, the thin film dielectric layer 30 may also be similarly patterned as the viewing side electrode 32 instead of being a continuous thin film dielectric layer 30, as shown in FIGS. 1A and 1B.

In general, with respect to the embodiments described above, a variety of substrates may be used, as would be understood by persons skilled in the art. Typically, the substrate is a rigid refractory sheet. Examples of suitable rigid refractory sheet materials include, but are not limited to, ceramics such as alumina, metal ceramic composites, glass ceramic materials and high temperature glass materials.

The row electrode may be any suitable electrically conductive layer known to those skilled in the art. Typically, the row electrode comprises gold or a silver alloy.

The thick dielectric layer is designed to provide high resistance against dielectric breakdown when the display is operated at the voltage required to produce the display luminescence. Typically, the thick dielectric layer comprises a sintered perovskite, piezoelectric or ferroelectric material such as lead magnesium niobate-lead titanate (PMN-PT) with a dielectric constant of several thousand and a thickness greater than about 10 micrometers to inhibit dielectric breakdown. The thick dielectric luminescent display described herein may also comprise a high dielectric constant planarizing layer exemplified by lead zirconate titanate (PZT) applied using sol gel or metal organic deposition methods and one or more thin film dielectric layers deposited thereon.

Further examples of suitable substrates, row electrodes and thick dielectric layers for use in the present invention are described in U.S. Pat. No. 5,432,015, and U.S. Patent Publication 2004/247858, the subject matter of both are incorporated herein by reference.

The thin dielectric layers used herein may include barium titanate, alumina, aluminum nitride, silicon oxynitride, barium tantalate, tantalum oxide and the like.

The electroluminescent phosphor layer used herein comprises any blue emitting electroluminescent phosphor material. Typically, a material that emits blue light with acceptable CIE coordinates and with a suitably high luminosity is used. The blue emitting electroluminescent phosphor material may comprise a blue emitting rare earth activated alkaline earth sulfide. The blue emitting rare earth activated alkaline earth sulfide may be selected from the group consisting of rare earth activated alkaline earth thioaluminates, rare earth activated alkaline earth thiooxyaluminates, rare earth activated alkaline earth thiogallates, rare earth activated alkaline earth thiooxygallates, rare earth activated alkaline earth thioindates, rare earth activated alkaline earth thiooxyindates and mixtures thereof. Typically, the blue emitting electroluminescent phosphor material is europium activated barium thioaluminate ($BaAl_2S_4$:Eu).

The CIE coordinates of the blue emitting electroluminescent phosphor material may be optimized by using an optical filter thereover.

The viewing side electrode is a transparent electrically conductive layer, typically, an oxide such as indium tin oxide (ITO).

The colour conversion layer used herein may comprise any suitable resin and any suitable photoluminescent material that emits light with the desired CIE coordinates and luminance upon excitation by blue light.

The resin(s) are chosen such that after partial curing, the resin(s) substantially resist deformation upon deposition of an additional layer and can be etched. Typically, an acrylate resin is used and may be selected from epoxy, vinyl, melamine, urethane acrylate resins, and mixtures thereof and the like. They may have a surfactant added to improve the wetting and leveling of the layer. In one specific embodiment, the resin is an acrylated-urethane resin, Luxil-1033, supplied by Pesiff Corp., 5576 Ambler Drive, Mississauga, Ontario, Canada L4W 2K9.

With respect to the terms "curing", "cure" or "cured", these terms may be understood to include, without being limited thereto, heating and/or drying.

The photoluminescent material may be any fluorescent dye or pigment that can be sufficiently excited by blue light, typically, organic dyes or pigments such as a red light emitting dye or pigment, a yellow light emitting dye or pigment, and a green light emitting dye or pigment. Some examples of suitable red light emitting dyes or pigments are ADS™-100RE (American Dye Source Inc., Canada), Brilliant Orange SR pigment (Radocolour Industries, India), and Lumogen™ F Red 300. An example of a suitable yellow emitting pigment is Lumogen™ F Yellow 083 (BASF Aktiengesellschaft of Germany). Some examples of suitable green light emitting dyes or pigments are ADS™-085GE (American Dye Source Inc., Canada) and Bright Yellow Conc. pigment (Radocolour Industries, India). In addition, dyes may be chosen from dyes used for tunable dye lasers that can be adequately excited with blue light.

The weight percentage of the photoluminescent material used in the colour conversion layer may be any suitable amount, however, it is typically in the range of about 25% by weight to about 55% by weight and, more typically, in the range of about 35% to about 45% by weight based on the total weight of the colour conversion layer. The weight percentage of the resin used in the colour conversion layer may be the balance of the weight.

The colour fidelity of the display is further improved by the addition of the optical enhancement layer. This layer may be a combined contrast enhancement and colour-correcting optical filtration layer which comprises any material that can efficiently absorb the ambient light at substantially all wavelengths except those transmitted from the respective red, green, and blue sub-pixels of the display to which the optical enhancement layer is associated therewith. For example, the optical enhancement layer comprises a filter pigment dispersed in a resin that is optimized to absorb ambient light at wavelengths other than those for the respective colour of each sub-pixel. The resin is selected so that it is compatible with the colour conversion layer. For example, the photoluminescent material used for the optical enhancement layer over a red-emitting colour conversion layer is optimized to have a high transmission at red emitting wavelengths while having a high absorbance at other wavelengths in the visible spectrum. Similar resins noted above with respect to the colour conversion layer may also be used in the optical enhancement layer. Typically, an acrylate resin is used and may be selected from epoxy, vinyl, melamine, urethane acrylate resins, and mixtures thereof and the like. A surfactant may be included to help in wetting the two layers and a photointiator was included to facilitate the UV curing and patterning. Specifically, a resin Luxi11033; -1035, -1039 and/or -1040—supplied by Pesiff Corp., 5576 Ambler Drive, Mississauga, Ontario, Canada L4W 2K9 can be used to prepare the paste for the optical enhancement layer The weight percentage of the photoluminescent material used in the optical enhancement layer may be any suitable amount, however, it is typically in the range of about 0.5% by weight to about 5% by weight and more typically in the range of about 0.75% by weight to about 1.5% by weight based on the total weight of the optical enhancement layer. The weight percentage of the resin used in the optical enhancement layer may be any suitable amount, however, it is typically in the range of about 95% by weight to about 99.5% by weight; more typically in the range of about 98.5% by weight to about 99.25% by weight based on the total weight of the optical enhancement layer.

The surfactant(s) and photoinitiator(s) used may be any suitable surfactant(s) and/or photoinitiator(s) known in the art.

Specific embodiments relating to the method for making an optical enhancement layer associated with a colour conversion layer for an electroluminescent display are described below.

For example, and without being limited thereto, a method for incorporating the optical enhancement layer may include combining the optical enhancement layer with a colour conversion layer or a blue-emitting electroluminescent inorganic phosphor layer. In one method for making a sub-structure for an electroluminescent display, wherein the sub-structure comprises a colour conversion layer associated with an optical enhancement layer, a partially cured colour conversion layer is first formed and then an optical enhancement layer is disposed on the partially cured colour conversion layer. The combined partially cured colour conversion layer and optical enhancement layer are patterned using photolithographic methods. Following exposure through a suitable photomask the unexposed areas are removed via a suitable etchant. Following etching, the color conversion layer and the optical conversion layer are hardened with a final cure.

In a more specific embodiment of the method, the optical enhancement material is deposited onto the partially cured colour conversion layer. Typically, partial curing includes curing the layer so that it has a sufficient rigidity to support at least one additional layer without substantial deformation so that suitable etching can be achieved for patterning. In an optional embodiment, the optical enhancement layer may be partially cured as well.

The colour conversion layer and the optical enhancement layer may be coupled in a single-mask lithographic patterning method for each set of sub-pixels (e.g. each set of red sub-pixels and each set of green sub-pixels) to improve the registry of the layers, thus providing improved luminance and colour fidelity and to simplify the fabrication method for the display. An appropriate selection of the resin systems for the colour conversion layer and for the optical enhancement layer is done to facilitate etching of the colour conversion layer and optical enhancement layer, in one step, to form the requisite pattern with adequate definition. Typically the optical enhancement layer is thinner than the colour conversion layer and is directly exposed to the etchant used for the lithographic method, so that the etch rate for the exposed optical enhancement layer is lower than for the partially cured colour conversion layer so that the exposed optical enhancement layer is not substantially removed during the etching process. More specifically, and without being limited thereto, a colour conversion material for one of the sub-pixels (e.g. green) is deposited over the entire area of the electroluminescent display and partially cured. An optical enhancement layer for that sub-pixel is deposited on the colour conversion layer. Both of these layers are patterned together using only one exposure mask and one etching step to remove any uncured material that was not exposed to UV light to form the first set of sub-pixels. This completes the patterning of the first set of sub-pixels. The second set of sub-pixels (e.g. red) is then prepared and patterned in a similar manner as that of the first set of sub-pixels. Finally, the third set of sub-pixels is completed by depositing an optical enhancement layer and exposing and etching the optical enhancement layer to form the blue sub-pixels.

Figure 2:
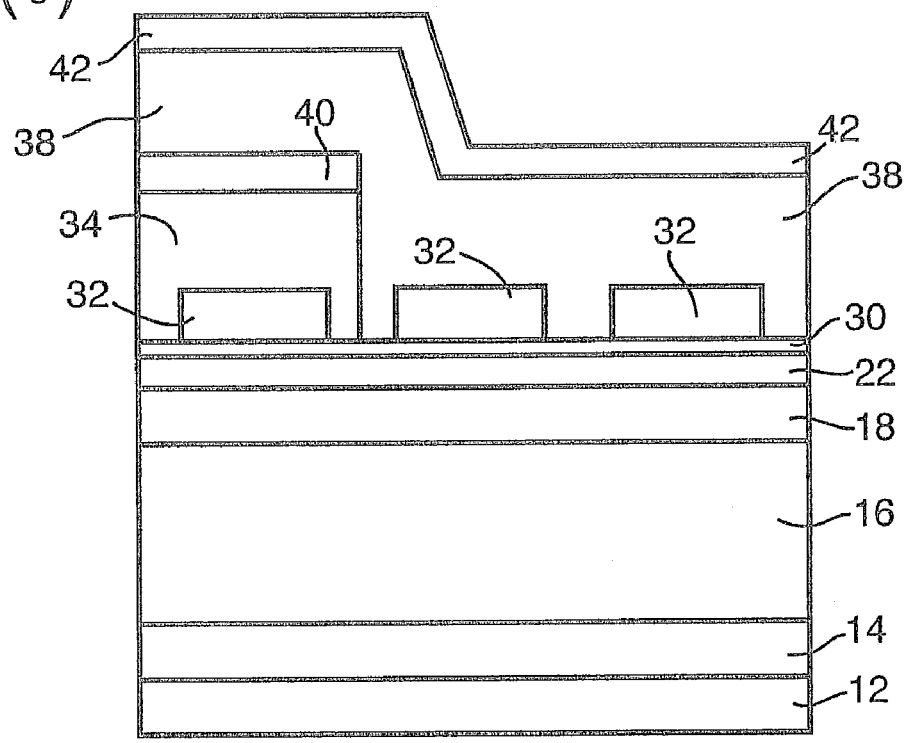
FIG. 2 is a schematic representation of an embodiment of a method for making a portion of a pixel sub-structure of an embodiment of an electroluminescent display of the present invention.
Figure 2:
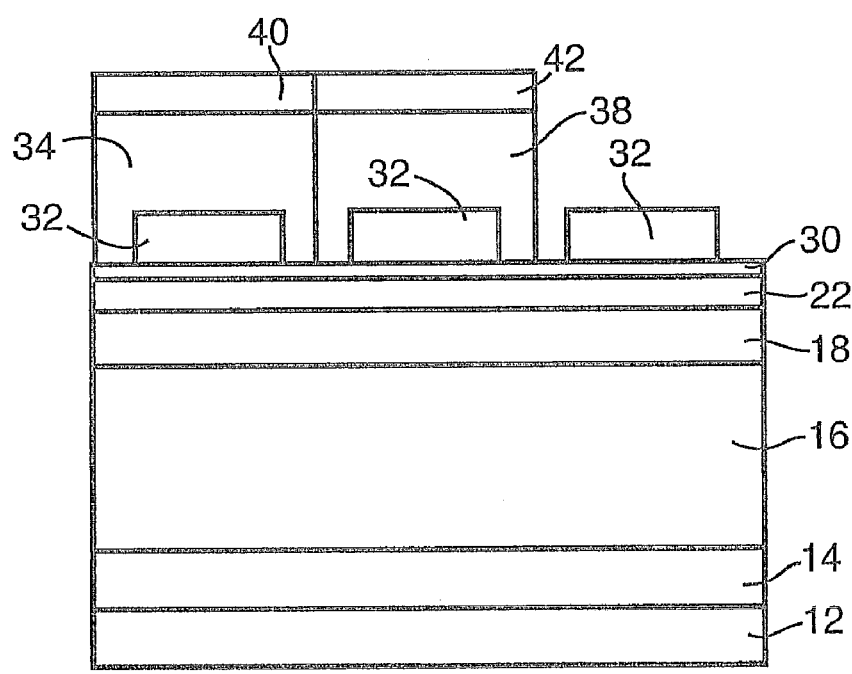
Figure 2:
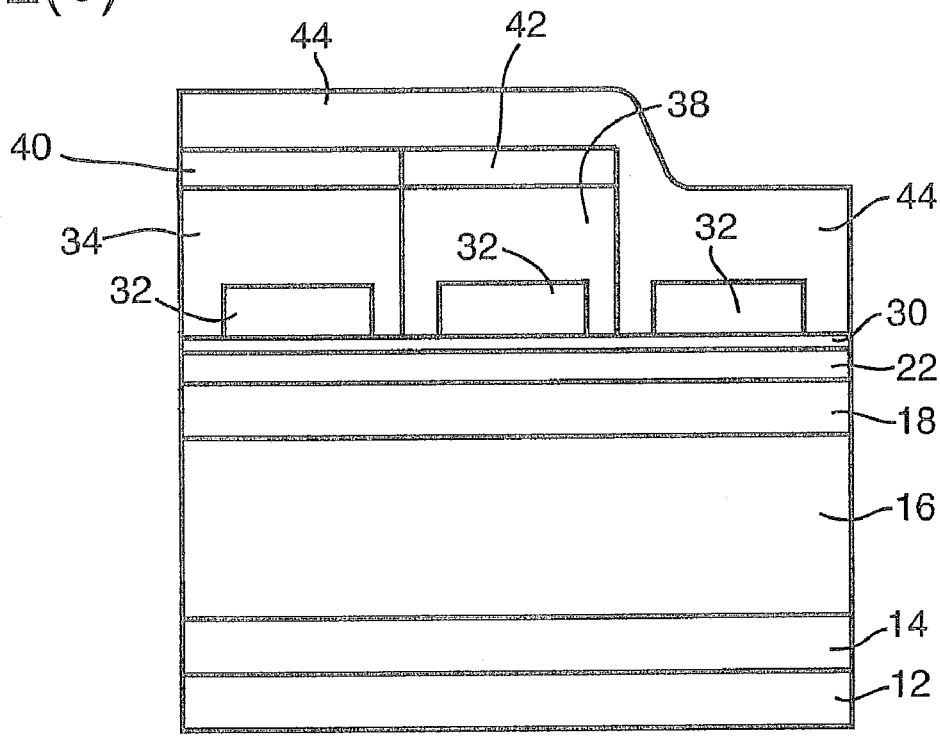
Figure 2:
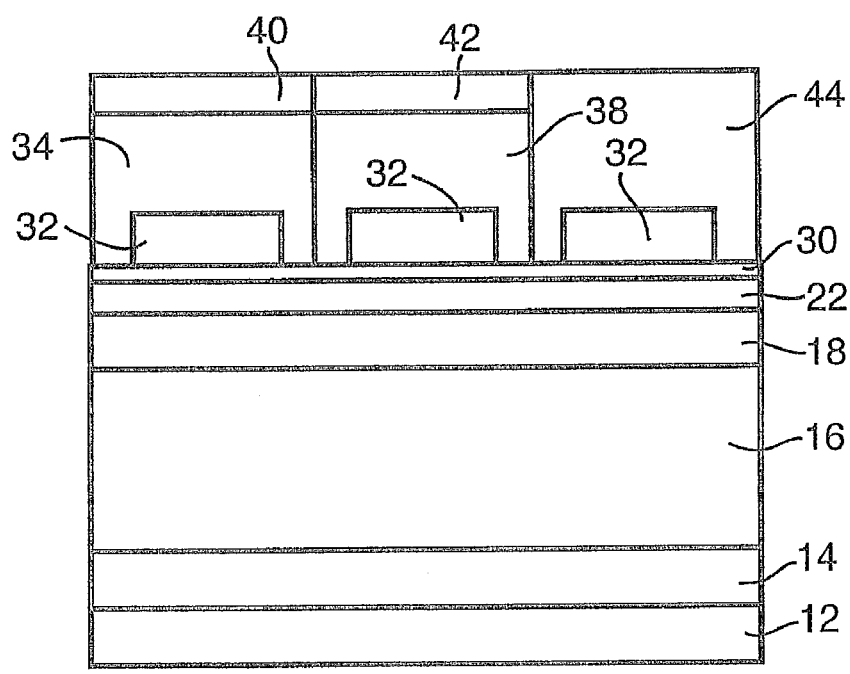

FIG. 2 shows a schematic of an embodiment of the method of the present invention. With respect to this embodiment, 1) a green colour conversion material is deposited on an array of blue emitting subpixels (22, 30 and 32) of a sub-structure 20 of an electroluminescent display 10, forming the green-emitting colour conversion layer 38. The green-emitting colour conversion layer 38 is partially cured. Optical enhancement material is deposited on the green colour conversion layer 38 to form the optical enhancement layer 42. 2) These layers 38 and 42 are then patterned to form the green sub-pixel column 26 using a single-mask photolithographic method. For example, a mask is laid on top of the optical enhancement layer 42, the uncovered portions of the optical enhancement layer 42 is exposed to UV light to initiate cross-linking of the optical enhancement layer 42 with the green colour conversion layer 38. An etchant is used to remove the unexposed portions of the optical enhancement layer 42 and the green colour conversion layer 38. A final cure of the layers is performed. 3) Next, a red colour conversion material is deposited on the array of blue emitting subpixels (22, 30 and 32) of the sub-structure 20 of the electroluminescent display 10, forming the red-emitting colour conversion layer 34. The red-emitting colour conversion layer 34 is partially cured. Optical enhancement material is deposited on the red colour conversion layer 34 to form the optical enhancement layer 40. 4) These layers 34 and 40 are then patterned to form the red sub-pixel column 24 using a similar single-mask photolithographic method. For example, a mask is laid on top of the optical enhancement layer 40, the uncovered portions of the optical enhancement layer 40 is exposed to UV light to initiate cross-linking of the optical enhancement layer 40 with the red colour conversion layer 34. An etchant is used to remove the unexposed portions of the optical enhancement layer 40 and the red colour conversion layer 34. A final cure of the layers is performed. 5) Finally, optical enhancement material is deposited on the array of blue emitting subpixels (22, 30 and 32) of the sub-structure 20 of the electroluminescent display 10, forming the optical enhancement layer 44. 6) The optical enhancement layer 44 is patterned using a photomask to remove it from the green and red sub-pixels so that it covers only the blue sub-pixel column 28. A final cure of the layers is done. It is noted that the final cure after each sub-pixel is formed is optional. Typically, the final cure is done following patterning of each sub-pixel set, in order to reduce the possibility of damage during processing. The method is applicable to deposition and patterning of the layers for green, red and blue sub-pixels in any order, and is not restricted to the order described in this embodiment. The single-mask method has many fewer steps than the method of the prior art, which entails forming and patterning the colour conversion materials for each of the red and green sub-pixels and then forming and patterning an optical enhancement layer over the previously patterned sub-pixel sets in sequence. In the method of the present invention, there is only one exposure step and one etching step for patterning of each set of sub-pixels, as compared to at least two exposure and etching steps for each set of sub-pixels of the prior art methods. The term "set of sub-pixels" or "sub-pixel sets" refers to a group of sub-pixels emitting one colour (e.g. set of green sub-pixels; green sub-pixel sets). In addition to saving process steps, the invention improves the registry of the various layers for the sub-pixel sets, so the optical performance is improved.

The colour conversion layer of the method of the present invention can be formed by depositing a paste of the colour conversion material using, for example, screen printing, stenciling, roll coating or any other suitable method for forming a substantially uniform layer. The paste can comprise an UV-patternable resin that can be partially cured so it has dimensional stability but at the same time can be patterned using lithographic methods or other suitable patterning methods. A paste of the optical enhancement material can be deposited onto the partially cured colour conversion layer. Typically, the colour conversion and optical enhancement materials are chemically compatible. The partially cured layers of the colour conversion and optical enhancement materials can be patterned with resolution and alignment accuracy sufficient to achieve the desired sub-pixel pattern by simultaneously exposing them to ultraviolet light through a photo-mask and etching away the unexposed portions of the stacked paste layers using a suitable etchant. Finally, the patterned layers can be subject to a final curing to form the final layers.

In an embodiment, the method comprises the deposition of a colour conversion layer comprising a paste containing a colour conversion pigment dispersed in a resin. The resin is an acrylate resin. The acrylate resin is dissolved in a compatible monomer solvent. The resin, dye, a surfactant, and a photo-initiator are dissolved to achieve the desired viscosity for printing, stenciling, roll coating, die coating, curtain coating or other methods used for depositing the paste as a layer on the appropriate substrate surface. The surfactant is added to the paste to facilitate wetting of the colour conversion layer on the substrate surface and subsequent deposited layers on the colour conversion layer. A photo-initiator is also added to the paste in order to facilitate cross-linking during photolithography. The deposited paste is dried and partially cured so that it has sufficient rigidity to support additional layer(s) without substantial deformation and so that subsequent lithographic patterning steps can be affected to pattern it commensurately with the display sub-pixel array. The deposited paste is dried and partially cured at a temperature of about 80° C. to about 130° C. for a time of about 5 to about 40 minutes.

Following partial curing of the colour conversion layer, an optical enhancement layer is deposited on the colour conversion layer. The optical enhancement layer functions as a combined contrast enhancement and colour-correction optical filtration layer. The optical enhancement layer also comprises an acrylate resin, a pigment or a dye, a photoinitiator and a surfactant. The optical enhancement layer is also partially cured in a manner similar to that used for the colour conversion layer.

The partially cured laminated structure is then patterned by exposure to light through a photo-mask to integrate both layers in the exposed region. The unexposed portions of the layers can then be removed using methanol, OCG-Rinse1, provided by Arch Chemicals, Connecticut, U.S., or a mixture of the two. Once the unexposed material has been removed the laminated structure is hard cured at a temperature of about 120° C. to about 140° C. for about 10 minutes to about 40 minutes to form the final structure.

Following the hard cure method for the first colour sub-pixel set, the second colour sub-pixel set is prepared in the same fashion. Then, for the blue sub-pixel set, only the optical enhancement layer is used and it can be fully cured following patterning without an intermediate pre-curing step.

The partial curing temperature and duration of curing the colour conversion layer and optical enhancement layer are dependent on the thermal properties of the substrate and the composition of the resin. Typically, the colour conversion layer or the optical enhancement layer, whichever is first deposited, is partially cured until it has sufficient rigidity to support additional layer(s) without substantial deformation and, if applicable, so that subsequent patterning can be effected to pattern it commensurately with the display sub-pixel array. The partial curing is, however, typically done at a temperature of about 80° C. to about 130° C. for a time of about 5 to about 40 minutes. The combined layers are patterned and integrated using photolithography or electron beam lithography or any other procedure that is capable of patterning and integrating the partially cured layers. For example, and without being limited thereto, the partially cured laminated structure can be exposed to light through a photomask, or can be exposed to a suitably directed collimated electron beam or laser beam to crosslink both layers in the exposed region.

The lithographic exposure may be done with or without a light source. In a photolithographic method, a broad spectrum ultraviolet or visible light source may be used, such as a mercury lamp or a monochromatic radiation source such as a laser. In this case, a photo-initiator that generates polymerization initiating free radicals is also added to the paste. Any suitable photo-initiator may be used but typical photo-initiators are α-hydroxyketones and bis-acylphoshinoxides (BAPO). Lithographic exposure may also be done using an electron beam to generate free radicals, in which case a photo-initiator is not necessary.

The unexposed portions of the layers can then be removed using a suitable developer solution. For example, and without being limited thereto, the suitable developer solution can be an alcohol, such as methanol, or a mixture thereof such as methanol and OCG-Rinse1 provided by Arch Chemicals, Connecticut, U.S.

Once the unexposed material has been removed the laminated structure can be hard cured to form the final structure. Typical curing temperatures are about 120° C. to about 140° C. for a duration of about 10 minutes to about 40 minutes.

Any suitable resin and photoluminescent materials may be used in the colour conversion layer and optical enhancement layer, as described above. The resin(s) are chosen such that after partial curing, the resin(s) substantially resist deformation upon deposition of an additional layer and can be successfully etched. Typically, an acrylate resin is used and may be selected from epoxy, melamine, vinyl, urethane acrylate resins, and mixtures thereof and the like. The compatible monomer solvent is any solvent that is capable of dissolving the resin and dye to provide the desired viscosity. Some examples of resins are Luxil-1033; -1035, -1039 and/or -1040, supplied by Pesiff Corp., 5576 Ambler Drive, Mississauga, Ontario, Canada L4W 2K9. One of these resins, Luxil-1039, was used to formulate a colour conversion layer. After partial curing at about 90° C. for about 20 minutes, the thermally-induced cross-linking of the resin is sufficiently hard following partial curing to substantially resist deformation during application of the optical enhancement layer and the layer is also etchable.

Another resin, Luxil-1040, provides a wider temperature range over which both an adequate hardness following the partial curing procedure to inhibit deformation during deposition of the subsequent layer and adequate etchability for patterning can be realized. When the film was partially cured at about 100° C. for about 15 minutes, there was no deformation and the film could also be etched.

As noted above, the photoluminescent material used in the layers may be any fluorescent dye or pigment that can be sufficiently excited by blue light. Typically, organic dyes or pigments such as a red light emitting dye or pigment, a yellow light emitting dye or pigment, and a green light emitting dye or pigment. Some examples of suitable red light emitting dyes or pigments are ADS™-100RE (American Dye Source Inc., Canada), Brilliant Orange SR pigment (Radocolour Industries, India), and Lumogen™ F Red 300. An example of a suitable yellow emitting dye is Lumogen™ F Yellow 083 (BASF Aktiengesellschaft of Germany). Some examples of suitable green light emitting dyes or pigments are ADS™-085GE (American Dye Source Inc., Canada) and Bright Yellow Conc. pigment (Radocolour Industries, India). In addition, dyes may be chosen from dyes used for tunable dye lasers that can be adequately excited with blue light.

The weight percentage of the photoluminescent material used in the colour conversion layer may be any suitable amount, however, it is typically in the range of about 25% by weight to about 55% by weight and, more typically, in the range of about 35% to about 45% by weight based on the total weight of the colour conversion layer. The weight percentage of the resin used in the colour conversion layer may be the balance of the weight.

The weight percentage of the photoluminescent material used in the optical enhancement layer may be any suitable amount, however, it is typically in the range of about 0.5% by weight to about 5% by weight and more typically in the range of about 0.75% by weight to about 1.5% by weight based on the total weight of the optical enhancement layer. The weight percentage of the resin used in the optical enhancement layer may be any suitable amount, however, it is typically in the range of about 95% by weight to about 99.5% by weight; more typically in the range of about 98.5% by weight to about 99.25% by weight based on the total weight of the optical enhancement layer.

All ranges described herein include any and all sub-ranges.

The above disclosure generally describes the present invention. A more complete understanding can be obtained by reference to the following specific Examples. These Examples are described solely for purposes of illustration and are not intended to limit the scope of the invention. Changes in form and substitution of equivalents are contemplated as circumstances may suggest or render expedient. Although specific terms have been employed herein, such terms are intended in a descriptive sense and not for purposes of limitation.

EXAMPLES

Example 1

A screen-printable paste was prepared by mixing about 39 grams of a red-emitting photoluminescent pigment (Brilliant Orange SR pigment Radocolour Industries of Ambala City, Haryana, India) into Luxil-1039 resin obtained from Pesiff Corp., 5576 Ambler Drive, Mississauga, Ontario, Canada L4W 2K9 so that the total weight of the paste was about 100 grams.

A 30 micrometer layer of this paste was screen printed over one of 4 blue emitting pixels on a substrate to form a photoluminescent layer. The conditions for the partial cure method were a curing temperature of about 90° C. and a curing time of about 18 minutes. Subsequent to the partial curing method and cooling of the substrate to room temperature, a second paste layer (i.e. the optical enhancement layer) was screen-printed on top of the colour conversion layer. This layer was coated using a paste consisting of 1.6 grams of the pigment ASL-Fuji Green pigment obtained from Fuji Pigments of Hyogo, Japan blended into Luxil-1039 resin obtained from Pesiff Corp., 5576 Ambler Drive, Mississauga, Ontario, Canada L4W 2K9. Following UV-exposure, the layers were etched using OCG-Rinse1.

The pixels partially cured at about 90° C. for about 18 minutes, could be etched without residue in the etched regions. These pixels showed no evidence of deformation of the colour conversion layer due to deposition of the optical enhancement layer. The pixels underwent a final cure at about 130° C. for about 30 minutes following etching.

Example 2

This example shows that the properties of the partially cured resin formulation of Example 1 are not substantially affected by the choice of photoluminescent materials dispersed in the layers. A pixel, similar to that of Example 1 except that the colour conversion layer contained the green-emitting pigment (Bright Yellow Conc. pigment obtained from Radocolour Industries of Ambala City, Haryana, India) instead of the red-emitting pigment and the optical enhancement layer contained a green pigment Fuji ASL-Green obtained from Fuji Pigments of Hyogo, Japan. The deformation resistance and etchability of the combined layers were similar to those of Example 1.

Example 3

This example shows that the partial curing temperature method range can be shifted by using a resin system that cross-links more slowly. A 100 gram paste batch was prepared by adding about 40 grams of a red-emitting photoluminescent pigment (Brilliant Orange SR pigment Radocolour Industries of Ambala City, Haryana, India) to about 60 grams of Luxil 1040 resin obtained from Pesiff Corp., 5576 Ambler Drive, Mississauga, Ontario, Canada L4W 2K9. A 30 micrometer layer of this paste was screen printed over a set of blue emitting pixels, as in the previous examples. The pixel sets were partially cured at about 100° C. for about 15 minutes.

Subsequent to the partial curing method and cooling of the substrate to room temperature, an optical enhancement layer using the same resin formulation as in Example-1 was screen-printed on top of the colour conversion layer. The optical enhancement layer was deposited from a paste prepared by blending 1.2 grams of the pigment ASL-Fuji Red pigment obtained from Fuji Pigments of Hyogo, Japan into the same resin used for the optical enhancement layer of example 1. Following UV-exposure through a photo-mask, the colour conversion and optical enhancement layers were etched using OCG-Rinse1 rinse as described previously to remove the unexposed material.

A well-defined pattern following etching was obtained. The pixels underwent a final cure at about 130° C. for about 30 minutes following etching.

Example 4

This example shows that the properties of the partially cured resin formulation of Example 3 are not substantially affected by the choice of photoluminescent materials dispersed in the layers. Pixels, similar to those of Example 3 except that the colour conversion layer contained the green-emitting pigment (Bright Yellow Conc. pigment obtained from Radocolour Industries of Ambala City, Haryana, India) instead of the red-emitting pigment and the optical enhancement layer contained the green pigment Fuji ASL-Green obtained from Fuji Pigments of Hyogo, Japan. The properties of the colour conversion layer were similar to those of Example 3.

Example 5

This example shows how the etching definition can be improved by changing the resin formulation to one that can be etched using a methanol-containing solution. The newly formulated resin used was Luxil-1033, supplied by Pesiff Corp., 5576 Ambler Drive, Mississauga, Ontario, Canada L4W 2K9, which is based on an acrylated-urethane resin. Methanol was used to etch the deposited colour conversion layer and optical enhancement layer. Although the methanol etched the colour conversion layer and optical enhancement layer, care was taken to limit the etching time to that required to etch the unexposed regions so that the exposed optical enhancement layer was not damaged by the etchant.

A paste was prepared by mixing about 45 grams of the red photoluminescent pigment used for Example 2 into about 55 grams of the resin described above. To form a photoluminescent layer, this paste was screen printed over a set of blue-emitting pixels, as in the previous examples. The set was partially cured at about 120° C. for about 15 minutes. Subsequent to the partial curing and cooling of the substrate to room temperature, an optical enhancement layer was deposited using a paste formulated by blending 1.2 grams of ASL-Fuji Red pigment obtained from Fuji Pigments of Hyogo, Japan into 100 grams of Luxil-1035 resin obtained from Pesiff Corp., 5576 Ambler Drive, Mississauga, Ontario, Canada L4W 2K9. Following UV-exposure, the pattern was successfully etched using 30% by weight methanol in OCG-Rinse 1 solution. A final cure was undertaken as for previous examples.

Example 6

This example shows that the properties of the partially cured resin formulation of Example 5 are not substantially affected by the choice of photoluminescent materials dispersed in the layers. Pixels, similar to those of Example 5 except that the colour conversion layer contained the green-emitting pigment (Bright Yellow Conc. pigment obtained from Radocolour Industries of Ambala City, Haryana, India) instead of the red-emitting pigment and the optical enhancement layer contained the green pigment ASL-Green obtained from Fuji Pigments of Hyogo, Japan. The properties of the colour conversion layer were similar to those of Example 5.

Example 7

This example illustrates a method for depositing and curing an optical enhancement layer for a blue sub-pixel set. A blue pigment, ASL Blue obtained from Fuji Pigments of Hyogo, Japan, which had a high transmission for wavelengths in the blue region of the spectrum and high absorbance for other wavelengths in the visible spectrum, was selected for this layer. For video applications, the blue emission after passing through this layer has a CIE y coordinate of about 0.085. To form the layer, 2% by weight of the blue pigment was mixed into the resins used for Examples 5 and 6. The substrate was then UV-exposed through a photo-mask, and the unexposed material was etched using OCG-Rinse 1. A final cure at about 130° C. for about 30 minutes was done following the etching process.

Example 8

This example illustrates the fabrication of colour conversion and optical enhancement layers on three pixel arrays to form full colour 17 inch diagonal 640×480 pixel electroluminescent displays using the paste formulations of Examples 5 and 6 for red and green sub-pixels and a paste similar to that of Example 7 for the blue sub-pixels.

Eight display panels were fabricated on blue-emitting pixel arrays. The green sub-pixels were formed first. The partial curing temperatures and times for the green sub-pixels on the eight pixel arrays were about 110° C. for about 20 minutes, about 110° C. for about 30 minutes, about 115° C. for about 15 minutes, about 115° C. for about 20 minutes, about 115° C. for about 25 minutes, about 120° C. for about 20 minutes, about 120° C. for about 25 minutes and about 120° C. for about 30 minutes, which were carried out in a well-ventilated oven. The mass loading for the combined photoluminescent and optical enhancement layers for the green and the red sub-pixels and the optical enhancement layer for the blue sub-pixels was adjusted to make the height of each sub-pixel approximately equal.

Figure 3:
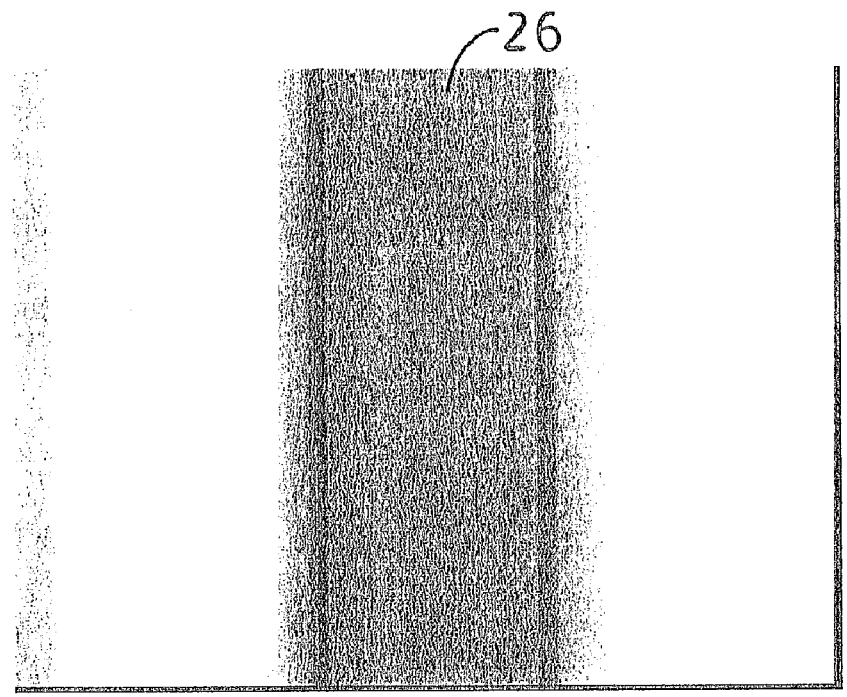
FIG. 3 is an optical micrograph of the surface of an embodiment of a partially fabricated electroluminescent display of the present invention having a patterned optical enhancement layer and a colour conversion layer for green sub-pixels.

The resin used in this experiment could be etched very effectively using methanol or a combination of methanol and an OCG-Rinse 1. For those panels cured at about 110° C., there were minor irregularities in the coverage and thickness of the optical enhancement layer. A controlled partial curing at about 115° C. for about 20 minutes gave the best results. The use of a mixture of methanol and OCG-Rinse 1 as the etchant resulted in a well-defined pattern with good edge definition to the green sub-pixel columns 26 as shown in FIG. 3. To improve patterning accuracy it is also possible to etch the layers in two steps, first using OCG-1 Rinse and then by a second rinse using methanol. A typical rinse program is a three step rinse: first using OCG-1 Rinse, then using methanol and finally using the OCG-1 Rinse again. The etch process should be carefully controlled to avoid over-etching that may lead to deformation and delamination of the patterned layers. A final cure at about 130° C. for about 30 minutes was done to complete the cross-linking of the resins in both layers.

Next, the red sub-pixel columns were formed using a screen with a mesh count of 400. Partial curing of the red pixel columns for about 115° C. for about 20 minutes resulted in well defined red and green sub-pixel columns with the optical enhancement layers remaining intact.

Figure 4:
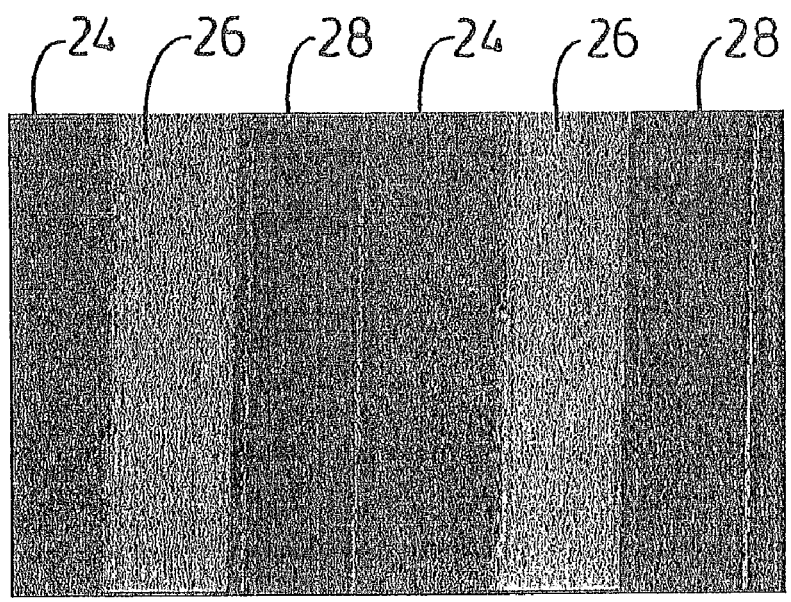
FIG. 4 is an optical micrograph of a portion of a surface of an embodiment of a completed electroluminescent display of the present invention having patterned optical enhancement layers and colour conversion layers for green, red and blue sub-pixels.
Figure 5:
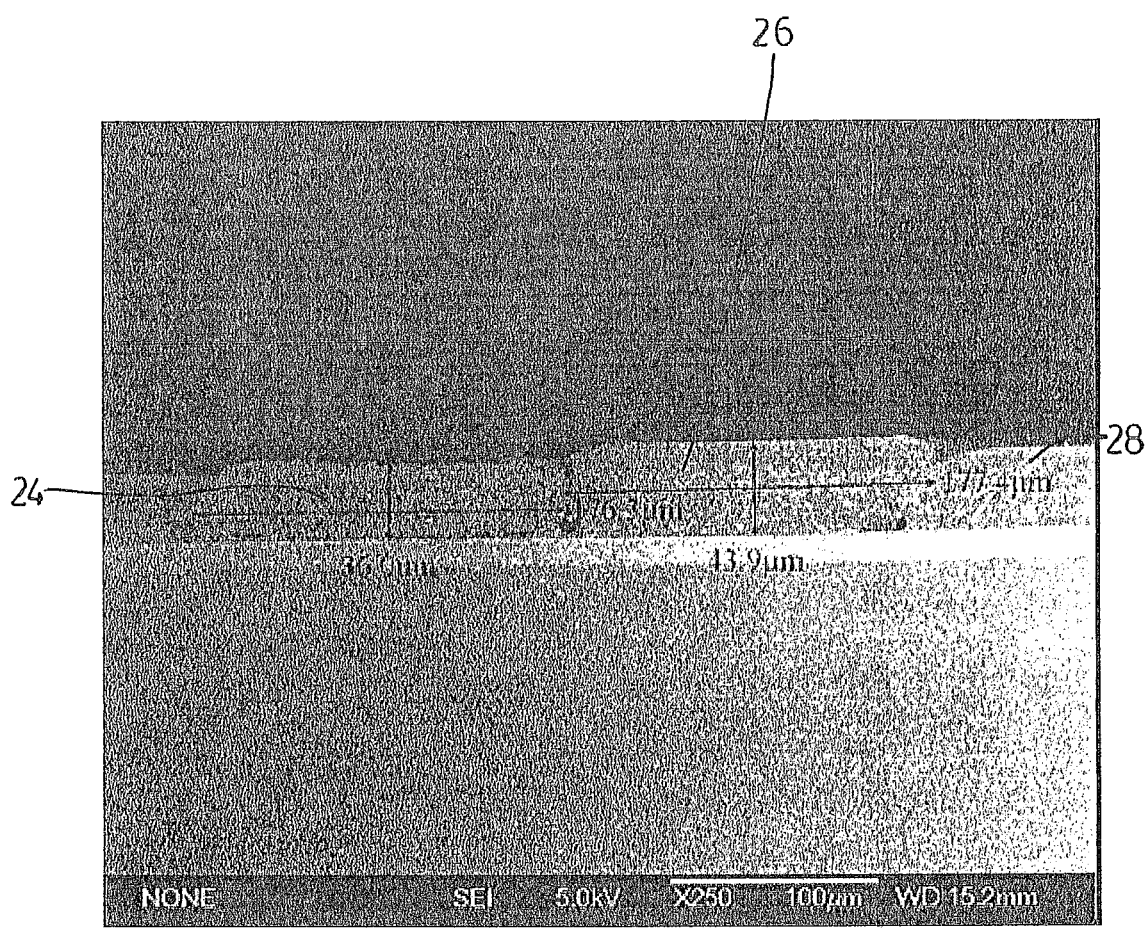
FIG. 5 is an optical micrograph of a cross-section of the completed electroluminescent display of FIG. 4.

Finally, the optical enhancement layer for the blue sub-pixel columns was deposited using a screen with a mesh count of 325 and then patterned. The panel was completed with a final cure at about 130° C. for about 30 minutes. FIG. 4 is an optical micrograph of a portion of the surface of the completed electroluminescent display, showing red sub-pixel columns 24, green sub-pixel columns 26, and blue sub-pixel columns 28 with good edge definition and uniform appearance. FIG. 5 is an optical micrograph showing a cross section of the deposited red sub-pixel columns 24, green sub-pixel columns 26, and blue sub-pixel columns 28 showing the well matched thickness of the layers. The thickness of the colour conversion layer and optical enhancement layers for each of the red, green and blue sub-pixels are matched to achieve acceptable display appearance and contrast under ambient lighting.

The completed panel was operated using a sine wave driving method as described in U.S. Pat. Nos. 6,448,950 and 6,819,308, the disclosure of which is incorporated by reference, with a maximum operating voltage for full luminance of 240 volts. The panel exhibited a maximum white luminance of 325 candelas per square meter with all of the red, green and blue pixels at the maximum voltage. A similar panel without the colour conversion or optical enhancement layers exhibited a blue luminance of 450 candelas per square meter at the same operating voltage.

The panel with the colour conversion and optical enhancement layers had CIE x and y coordinates of about 0.67 and about 0.32 for the red sub-pixel set, about 0.24 and about 0.685 for the green sub-pixel set and about 0.14 and about 0.085 for the blue sub-pixel set.

Optical reflectance and the CIE coordinates of light reflected from the panel were measured and for comparison purposes were also measured for several commercially available television sets. The measurements were made using a Minolta CS-1000 spectro-radiometer while the panel was illuminated by a D50 lamp from Tailored Lighting of Rochester N.Y. The position of the lamp and panel with respect to the spectroradiometer were kept fixed to ensure repeatable measurements. The reflectance and colour coordinate measurements were made relative to measurements from a Minolta CS-A5 standard white calibration plate. The reflectance ratio is the reflectance of the panel as a fraction of the reflectance of the white plate. The CIE colour shifts are the difference between the CIE coordinates for the panel and for the White plate. The reflectance and the shifts in the colour coordinates for light reflected from the panel with respect to those for light reflected from the white plate is indicative of the darkness and neutral colour of the panel when it is turned off and hence the achievable contrast ratio. Low reflectance and small colour coordinate shifts are therefore desirable. The reflectance ratio and CIE x and y coordinates for the panel and for several commercial television sets are given in Table 1. As can be seen from this data, the performance of the panel compares favourably to that of the commercial CRT, LCD (liquid crystal display) and PDP (plasma display panel) based television sets.

TABLE 1

| Product | Reflectance | CIE x-shift | CIE y-shift |
| --- | --- | --- | --- |
| Product of Example 8 | 8% | 0.017 | 0.018 |
| PDP (Panasonic) | 5.1% | −0.013 | 0.008 |
| CRT (Toshiba) | 11.5% | −0.018 | −0.020 |
| CRT (Sony) | 8% | −0.003 | 0.010 |
| LCD (Samsung) | 1.2% | −0.012 | −0.002 |

The sub-pixel layers can be deposited in a different order. In another example the layers for the red sub-pixels were deposited first, the layers for the green sub-pixels were deposited second and the blue filter layer for the blue sub-pixels was deposited last. The paste loading was adjusted to ensure that the deposited layers for each sub-pixel set were of about the same thickness. The red paste was formulated by mixing 43 grams of red pigment into 57 grams of resin and the green paste was formulated by adding 38 grams of green pigment into 62 grams of resin. The composition of the filter paste for the blue sub-pixels was as in example 7.

Example 9

This example shows the fabrication and performance of a combined photoluminescent colour conversion layer and optical enhancement layer fabricated on a cover glass that was aligned and bonded to a blue-emitting electroluminescent device.

A set of three blue-emitting electroluminescent pixels having an europium activated barium thioaluminate phosphor layer were fabricated on a 5 centimeter (length)×5 centimeter (width)×1 millimeter (thick) glass or alumina substrate fabricated using the methods as described in U.S. Patent Publication 2004/0013906.

In this example, the green sub-pixel was formed by first coating the optical enhancement layer on the plain glass substrate using the same paste as that described in Example 8. This layer was partially cured at about 110° C. for about 5 minutes, and then a green-emitting colour conversion layer was coated on top of the optical enhancement layer using a paste that was similar to that used in Example 8. Then the coated substrate was UV-exposed through a photo-mask to obtain the desired pixel pattern. The unexposed material on the substrate was etched off using methanol. A final cure at about 130° C. for about 30 minutes was performed.

Following the formation of the green sub-pixel, a red sub-pixel was formed. An optical enhancement layer was screen-printed from a paste similar to that of Example 8. The printed layer was then partially cured at about 110° C. for about 5 minutes. After cooling to room temperature, a red-emitting colour conversion layer was deposited over the optical enhancement layer by screen printing using a paste similar to that in Example 8. The red sub-pixel was patterned through UV-exposure using a photo-mask. Following the exposure, the unexposed area was etched using methanol. A final cure at about 130° C. for about 30 minutes was done following etching.

To form a blue sub-pixel, the same optical enhancement layer that was used for the blue sub-pixel of Example 7 was deposited onto the glass substrate. The purpose of the optical enhancement layer is to serve as a colour-correction layer for the blue sub-pixel.

This example shows that a combined and patterned colour conversion layer and optical enhancement layer can be formed on a glass substrate and hence, the method for forming these layers (e.g. a first component), which involves water and protic solvents, can be separated from the method for forming the other portion of the electroluminescent display (e.g. a second component), the second component of which is subject to hydrolysis if exposed to water or protic solvents. The first component is aligned with the second component of the electroluminescent display and an optically transparent medium with an appropriate optical index of refraction is injected between the two components to facilitate efficient light transmission from the second component to the colour conversion layers of the first component.

The invention claimed is:

1. A pixel sub-structure for an electroluminescent display, the sub-structure comprising:
 a colour conversion layer; and
 an optical enhancement layer;
 wherein at least a portion of the colour conversion layer is integrated with at least a portion of the optical enhancement layer.

2. A pixel sub-structure according to claim 1, wherein said at least a portion of the colour conversion layer is covalently bonded to said at least a portion of the optical enhancement layer.

3. A pixel sub-structure according to claim 1, wherein said at least a portion of the colour conversion layer is cross-linked to said at least a portion of the optical enhancement layer.

4. A pixel sub-structure according to claim 1, wherein the colour conversion layer is disposed on the optical enhancement layer or vice-versa.

5. A pixel sub-structure according to claim 1, wherein the colour conversion layer absorbs blue light and emits a coloured light other than blue light.

6. A pixel sub-structure according to claim 5, wherein the colour conversion layer and the optical enhancement layer, each comprises a resin and a photoluminescent material.

7. A pixel sub-structure according to claim 6, wherein the resin, after partial curing, substantially resists deformation upon deposition of an additional layer and is etchable.

8. A pixel sub-structure according to claim 6, wherein the resin comprises an acrylate resin.

9. A pixel sub-structure according to claim 8, wherein the acrylate resin comprises at least one of melamine, epoxy, vinyl, aliphatic, and urethane acrylate resins.

10. A pixel sub-structure according to claim 6, wherein the photoluminescent material is a dye or pigment.

11. A pixel sub-structure according to claim 10, wherein the dye or pigment is selected from the group consisting of a red light emitting dye or pigment, a green light emitting dye or pigment, and a yellow light emitting dye or pigment.

12. A pixel sub-structure according to claim 6, wherein the optical enhancement layer is optimized to absorb ambient light.

13. A pixel sub-structure according to claim 6, wherein the colour conversion layer comprises the photoluminescent material in the range of about 25% by weight to about 55% by weight based on the total weight of the colour conversion layer.

14. A pixel sub-structure according to claim 6, wherein the optical enhancement layer comprises the photoluminescent material in the range of about 0.5% by weight to about 5% by weight based on the total weight of the optical enhancement layer.

15. A pixel sub-structure according to claim 1, wherein at least one of the colour conversion layer and the optical enhancement layer further comprise at least one of a surfactant and a photo-initiator.

16. A pixel sub-structure for a thick film dielectric electroluminescent display, the pixel sub-structure comprising:
at least two sub-pixels, each sub-pixel comprising a blue light emitting electroluminescent inorganic phosphor layer;
at least one colour conversion layer, each colour conversion layer being associated with a respective one of the sub-pixels such that the blue light emitted by each respective one of the sub-pixels is substantially absorbed by the associated colour conversion layer thereby causing the colour conversion layer to emit a coloured light other than the blue light; and
at least one optical enhancement layer, at least a portion of each optical enhancement layer being integrated with at least a portion of a respective one of the colour conversion layers.

17. A pixel sub-structure according to claim 16, wherein the sub-structure further comprises at least one optical enhancement layer that is directly associated with a respective one of the sub-pixels such that the blue light directly emitted by each respective one of the sub-pixels is substantially colour corrected.

18. A pixel sub-structure according to claim 16, wherein said at least a portion of each optical enhancement layer is covalently bonded to said at least a portion of the respective one of the colour conversion layers.

19. A pixel sub-structure according to claim 16, wherein said at least a portion of each optical enhancement layer is cross-linked to said at least a portion of the respective one of the colour conversion layers.

20. A pixel sub-structure according to claim 16, wherein said at least one colour conversion layer and said at least one optical enhancement layer, each comprises a resin and a photoluminescent material.

21. A pixel sub-structure according to claim 20, wherein the resin, after partial curing, substantially resists deformation upon deposition of an additional layer and is etchable.

22. A pixel sub-structure according to claim 21, wherein the resin comprises an acrylate resin.

23. A pixel sub-structure according to claim 20, wherein said at least one optical enhancement layer is optimized to absorb ambient light.

24. A pixel sub-structure according to claim 20, wherein said at least one colour conversion layer comprises the photoluminescent material in the range of about 25% by weight to about 55% by weight based on the total weight of the colour conversion layer.

25. A pixel sub-structure according to claim 20, wherein said at least one optical enhancement layer comprises the photoluminescent material in the range of about 0.5% by weight to about 5% by weight based on the total weight of the optical enhancement layer.

26. A pixel sub-structure according to claim 20, wherein at least one of the colour conversion layer and the optical enhancement layer further comprise at least one of a surfactant and a photo-initiator.

27. A pixel sub-structure according to claim 16, wherein at least one thin dielectric layer is on at least one surface of said blue light emitting electroluminescent inorganic phosphor layer.

28. A pixel sub-structure according to claim 16 for a thick film dielectric electroluminescent display, the pixel sub-structure comprising:
three sub-pixels, each sub-pixel comprising the blue light emitting electroluminescent inorganic phosphor layer; and
a first colour conversion layer associated with one of the sub-pixels such that the blue light emitted by that sub-pixel is substantially absorbed by the first colour conversion layer thereby causing the first colour conversion layer to emit a coloured light other than the blue light;
a second colour conversion layer associated with an other one of the sub-pixels such that the blue light emitted by that sub-pixel is substantially absorbed by the second colour conversion layer thereby causing the second colour conversion layer to emit a coloured light other than the blue light and the coloured light of the first colour conversion layer; and
at least one optical enhancement layer, at least a portion of each being integrated with at least a portion of a respective one of the colour conversion layers.

29. A pixel sub-structure according to claim 28, wherein at least a portion of a first optical enhancement layer is integrated with at least a portion of the first colour conversion layer; at least a portion of a second optical enhancement layer is integrated with at least a portion of the second colour conversion layer; and a
third optical enhancement layer is associated with the sub-pixel without a colour conversion layer.

30. A pixel sub-structure according to claim 28, wherein at least one thin dielectric layer is on at least one surface of said blue light emitting electroluminescent inorganic phosphor layer.

31. A pixel sub-structure according to claim 28, wherein the pixel sub-structure further comprises a transparent cover plate, wherein said at least one optical enhancement layer is coupled thereto.

32. A thick film dielectric electroluminescent display having pixels, each pixel comprising, in sequence:
   a substrate;
   a row electrode;
   a thick dielectric layer;
   and a pixel sub-structure according to claim 28.

33. A thick film dielectric electroluminescent display having pixels, each pixel comprising a thick dielectric layer associated with a pixel sub-structure, the pixel sub-structure comprising:
   a blue light emitting electroluminescent phosphor layer;
   at least two viewing side electrodes associated with the blue emitting electroluminescent phosphor layer;
   at least one colour conversion layer, each colour conversion layer being associated with a respective one of the viewing side electrodes such that the blue light emitted by the electroluminescent phosphor layer is substantially absorbed by the associated colour conversion layer thereby causing the colour conversion layer to emit a coloured light other than the blue light; and
   at least one optical enhancement layer, at least a portion of each optical enhancement layer being integrated with at least a portion of a respective one of the colour conversion layers.

34. A method for making a pixel sub-structure for an electroluminescent display, the pixel sub-structure comprising a colour conversion layer associated with an optical enhancement layer, the method comprising:
   a) forming a colour conversion layer;
   b) forming an optical enhancement layer associated with the colour conversion layer; and
   c) integrating at least a portion of the colour conversion layer with at least a portion of the optical enhancement layer.

35. A method according to claim 34, wherein the colour conversion layer is capable of being etched and has a sufficient rigidity to support at least one additional layer without substantial deformation.

36. A method according to claim 34, wherein the optical enhancement layer is capable of being etched and has a sufficient rigidity to support at least one additional layer without substantial deformation.

37. A method according to claim 35, wherein the colour conversion layer is partially cured so that it is capable of being etched and has a sufficient rigidity to support said at least one additional layer without substantial deformation.

38. A method according to claim 36, wherein the optical enhancement layer is partially cured so that it is capable of being etched and has a sufficient rigidity to support said at least one additional layer without substantial deformation.

39. A method according to claim 35, wherein the optical enhancement layer is disposed on the colour conversion layer.

40. A method according to claim 36, wherein the colour conversion layer is disposed on the optical enhancement layer.

41. A method according to claim 34, wherein during c), at least a portion of the colour conversion layer is covalently bonded with at least a portion of the optical enhancement layer.

42. A method according to claim 34, wherein during c), at least a portion of the colour conversion layer is cross-linked with at least a portion of the optical enhancement layer.

43. A method according to claim 34, wherein the method further comprises repeating a) to c) using a different colour conversion layer and optical enhancement layer.

44. A method according to claim 34, wherein a) to c) forms a first set of sub-pixels that emits a coloured light and the method further comprises repeating a) to c) using a different colour conversion layer and optical enhancement layer to form a second set of sub-pixels that emits a coloured light that is different than the coloured light of the first set of sub-pixels.

45. A method according to claim 34, wherein integrating is achieved using patterning.

46. A method according to claim 45, wherein patterning is achieved using lithography.

47. A method according to claim 45, wherein patterning is achieved using at least one of photolithography and electron beam lithography.

48. A method according to claim 45, wherein patterning is achieved using single-mask self-aligning lithography.

49. A method according to claim 34, wherein the method further comprises curing of the integrated layers.

50. A method according to claim 46, wherein lithographic exposed areas of the layers remain and the unexposed areas of the layers are removed using an etchant.

51. A method according to claim 50, wherein the etchant is a developer solution.

52. A method according to claim 37, wherein partial curing is conducted at a temperature of about 80° e to about 130° e for a time of about 5 to about 40 minutes.

53. A method according to claim 34, wherein the colour conversion layer absorbs blue light and emits a coloured light other than blue light.

54. A method according to claim 53, wherein the colour conversion layer and the optical enhancement layer, each comprises a resin and a photoluminescent material.

55. A method according to claim 54, wherein the resin comprises an acrylate resin.

56. A method according to claim 55, wherein the acrylate resin comprises at least one of melamine, epoxy, vinyl, aliphatic, and urethane acrylate resins.

57. A method according to claim 54, wherein the photoluminescent material is a dye or a pigment.

58. A method according to claim 57, wherein the dye or pigment is selected from the group consisting of a red light emitting dye or pigment, a green light emitting dye or pigment, and a yellow light emitting dye or pigment.

59. A method according to claim 34, wherein the optical enhancement layer is optimized to absorb ambient light.

60. A method according to claim 54, wherein the colour conversion layer comprises the photoluminescent material in the range of about 25% by weight to about 55% by weight based on the total weight of the colour conversion layer.

61. A method according to claim 54, wherein the optical enhancement layer comprises the photoluminescent material in the range of about 0.5% by weight to about 5% by weight based on the total weight of the optical enhancement layer.

62. A method according to claim 34, wherein at least one of the colour conversion layer and the optical enhancement layer further comprise at least one of a surfactant and a photoinitiator.

63. A method of making a pixel sub-structure for a thick film dielectric electroluminescent display, the pixel sub-structure comprising at least two sub-pixels, each sub-pixel comprising a blue light emitting electroluminescent inorganic phosphor layer, the method comprising:
   disposing a colour conversion layer over said at least two sub-pixels and partially curing the colour conversion layer;
   disposing an optical enhancement layer over the partially cured colour conversion layer; and patterning the optical enhancement layer and the partially cured colour conversion layer together whereby the colour conversion layer and optical enhancement layer are associated with at least one of said sub-pixels such that the blue light emitted by said at least one sub-pixels is substantially absorbed by the colour conversion layer thereby causing said colour conversion layer to emit a coloured light other than the blue light and such that coloured light is substantially colour corrected by the optical enhancement layer.

64. A method of making a pixel sub-structure for a thick film dielectric electroluminescent display, the pixel sub-structure comprising at least two sub-pixels, each sub-pixel comprising a blue light emitting electroluminescent inorganic phosphor layer, the method comprising:

disposing an optical enhancement layer onto a transparent cover plate and partially curing the optical enhancement layer;

disposing a colour conversion layer over the partially cured optical enhancement layer; and patterning the partially cured optical enhancement layer and the colour conversion layer together;

disposing the transparent cover plate, comprising the partially cured optical enhancement layer and the partially cured colour conversion layer, over said at least two sub-pixels whereby the colour conversion layer and optical enhancement layer are associated with at least one of said sub-pixels such that the blue light emitted by said at least one sub-pixels is substantially absorbed by the colour conversion layer thereby causing said colour conversion layer to emit a coloured light other than the blue light and such that coloured light is substantially colour corrected by the optical enhancement layer.

* * * * *